(12) United States Patent
Wang et al.

(10) Patent No.: US 10,483,478 B2
(45) Date of Patent: Nov. 19, 2019

(54) BUFFER ASSISTED CHARGE GENERATION LAYER FOR TANDEM OLEDS

(71) Applicant: eMagin Corporation, Hopewell Junction, NY (US)

(72) Inventors: Qi Wang, Hopewell Junction, NY (US); Evan P. Donoghue, Hopewell Junction, NY (US); Ilyas I. Khayrullin, Hopewell Junction, NY (US); Tariq Ali, Hopewell Junction, NY (US); Kerry Tice, Hopewell Junction, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/908,502

(22) Filed: Feb. 28, 2018

(65) Prior Publication Data

US 2018/0254422 A1    Sep. 6, 2018

Related U.S. Application Data

(60) Provisional application No. 62/465,539, filed on Mar. 1, 2017.

(51) Int. Cl.
*H01L 51/50* (2006.01)
*H01L 27/32* (2006.01)
*H01L 51/52* (2006.01)

(52) U.S. Cl.
CPC ........ *H01L 51/504* (2013.01); *H01L 27/3213* (2013.01); *H01L 27/3244* (2013.01); *H01L 51/5056* (2013.01); *H01L 51/5072* (2013.01); *H01L 51/5278* (2013.01); *H01L 27/3211* (2013.01)

(58) Field of Classification Search
CPC .............. H01L 27/3211; H01L 51/504; H01L 51/5056; H01L 51/5072; H01L 51/5278; H01L 27/3213; H01L 27/3244
USPC .......................................................... 257/40
See application file for complete search history.

(56) References Cited

U.S. PATENT DOCUMENTS

| 2010/0012178 A1* | 1/2010 | Yang | B82Y 10/00 |
| | | | 136/256 |
| 2010/0193033 A1* | 8/2010 | Uetani | B82Y 10/00 |
| | | | 136/263 |
| 2014/0230900 A1* | 8/2014 | Cull | H01L 51/0007 |
| | | | 136/263 |
| 2016/0126485 A1* | 5/2016 | Lee | H01L 51/5278 |
| | | | 257/40 |

(Continued)

*Primary Examiner* — Long K Tran
(74) *Attorney, Agent, or Firm* — Kaplan Breyer Schwarz, LLP

(57) ABSTRACT

A tandem Organic Light Emitting Diode (OLED) apparatus and method of fabricating the same, where the tandem OLED apparatus includes a buffer assisted charge generation layer having a junction of a p-type doped semiconductor layer and an n-type doped semiconductor layer, where a hole buffer layer and an electron buffer layer pair surrounding the junction of the p-type and n-type doped semiconductor layers. The OLED apparatus further includes a first OLED emissive layer and a second OLED emissive layer pair surrounding the buffer assisted charge generation layer, and a cathode and anode layer pair further surrounding the first and second OLED emissive layer pair.

14 Claims, 7 Drawing Sheets

(56) References Cited

U.S. PATENT DOCUMENTS

2017/0194387 A1* 7/2017 Oh ..................... H01L 51/5218

* cited by examiner

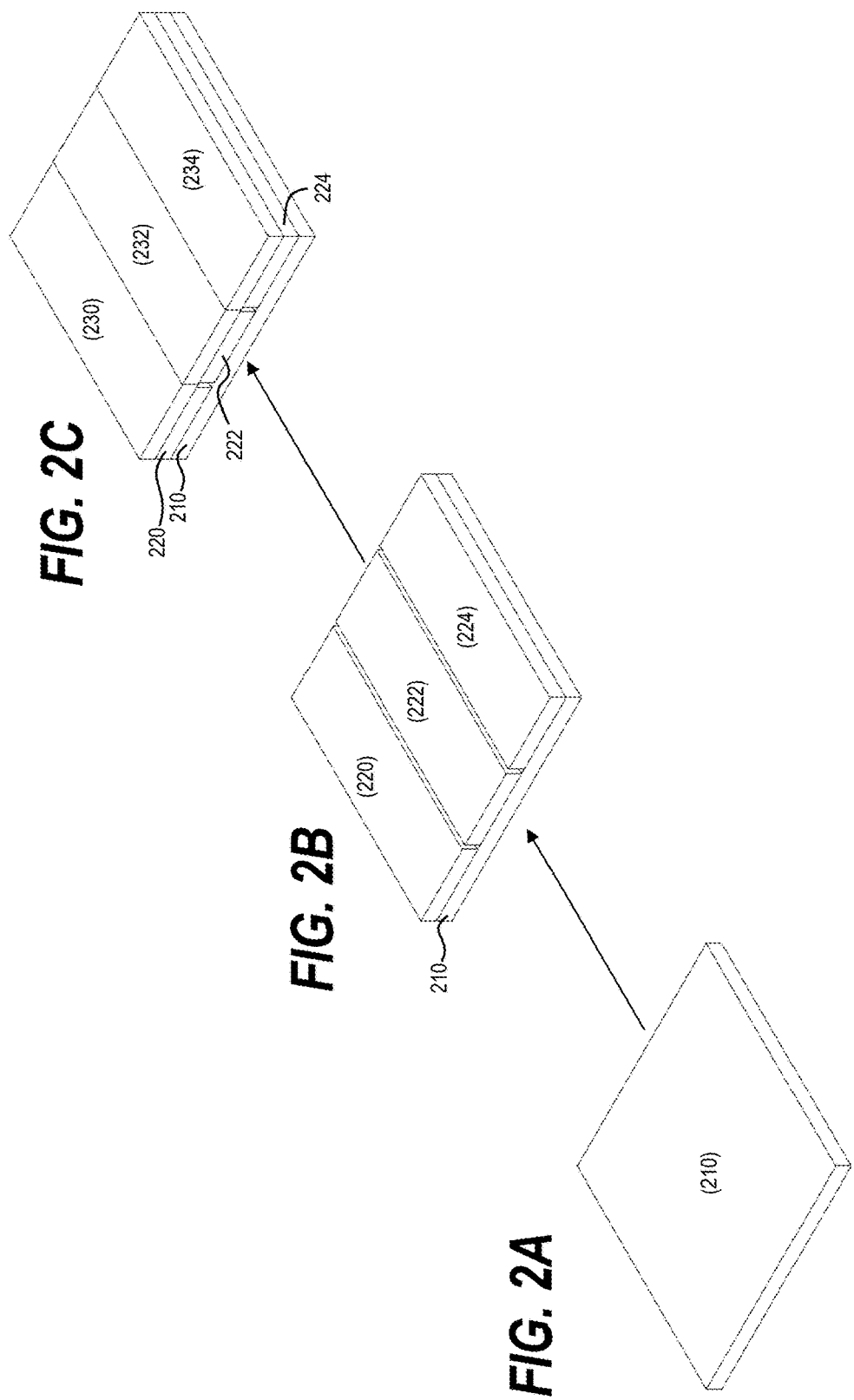

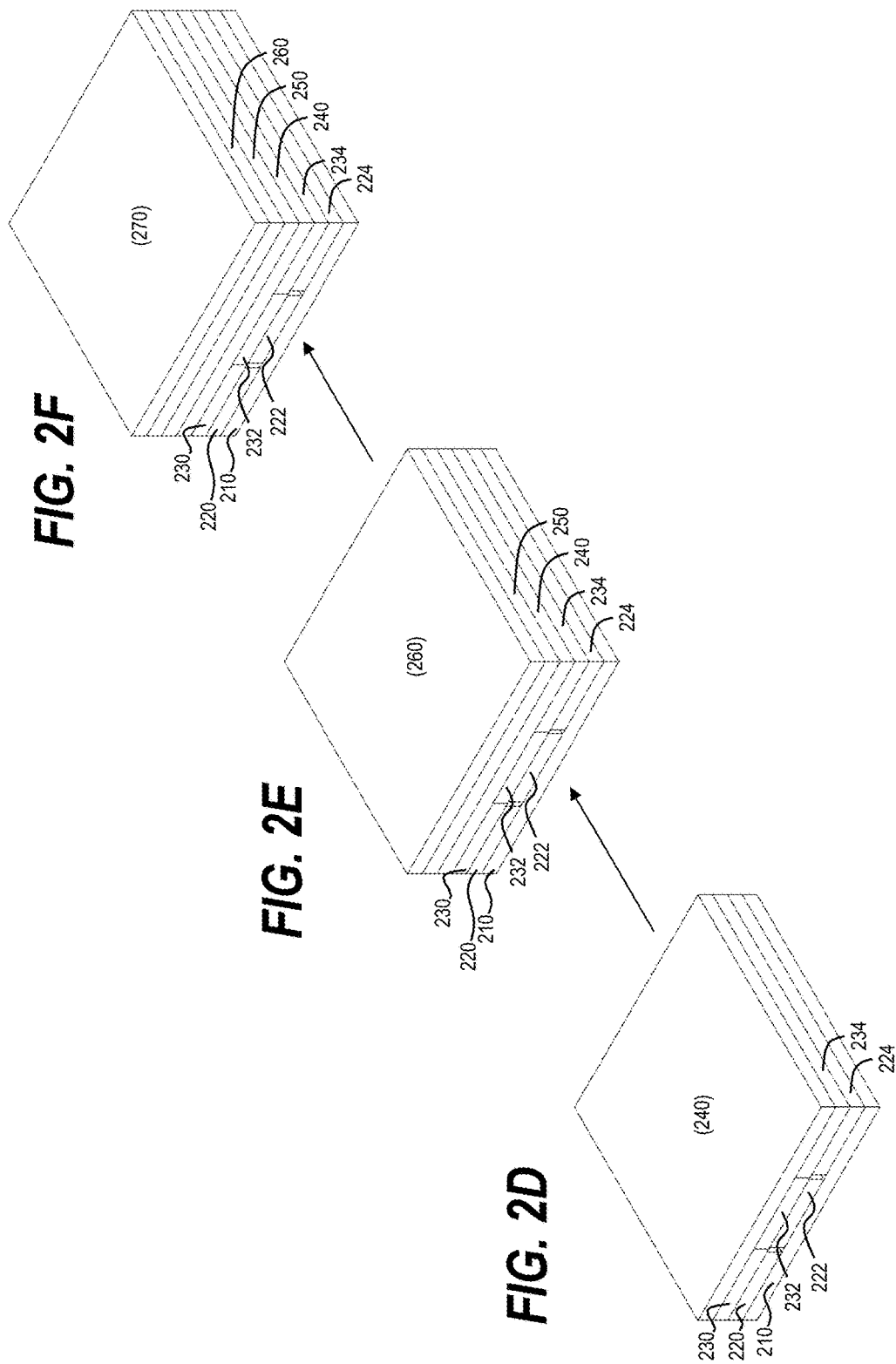

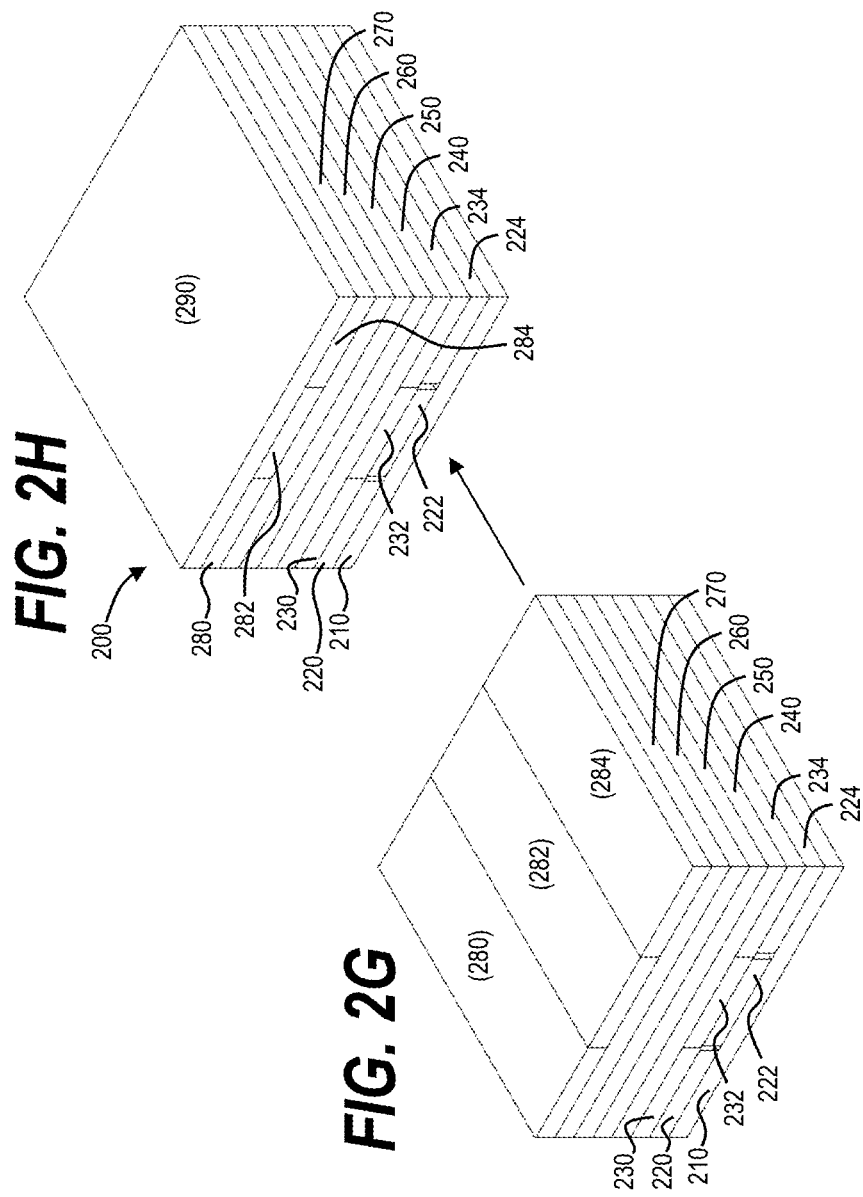

US 10,483,478 B2

BUFFER ASSISTED CHARGE GENERATION LAYER FOR TANDEM OLEDS

RELATED APPLICATION INFORMATION

This application claims the benefit of U.S. Provisional Application No. 62/465,539 filed Mar. 1, 2017, which is incorporated herein by reference.

BACKGROUND

Tandem Organic Light Emitting Diodes (OLEDs), as compared with conventional OLEDs, have received broad attention owning to their superior current efficiency, brightness and operational lifetime. In tandem OLEDs, several individual electroluminescent (EL) units are electrically connected in series via connecting stacks (sometime referred to as connecting electrodes) which function as charge generation layer (CGL), where holes and electrons are generated and injected into the adjacent hole transporting layers (HTL) and electron transporting layers (ETL), respectively. In principle, the device characteristics such as voltage, luminance, and current efficiency scale linearly with the number of EL units for tandem device with an efficient CGL.

FIG. 1 illustrates a conventional tandem OLED sub-pixel 100 including a backplane substrate 110, an anode layer 120, a first organic emission layer 130, an n-type doped semiconductor layer 140, a p-type doped semiconductor layer 150, a second organic emission layer 160, and a cathode layer 170. N-type doped semiconductor layer 40 and p-type doped semiconductor layer 50 form the CGL between the first and second organic emission layers 130 and 160, respectively.

The CGL plays an essential role in the tandem OLED performance, which is composed of an n-doped semiconductor layer and a p-doped semiconductor layer junction for injection of electrons and holes, respectively. At an initial stage of device operation, free electrons and holes are supplied from the CGL. At a subsequent stage, when a bias is applied to the device, these free electrons and holes in the CGL can transport and inject into their adjacent EL units; while electrons and holes from the cathode and anode also inject into the EL units, respectively. Thereafter, bipolar currents gradually reach a steady state.

It is important to select proper material combinations to form an efficient p-type and n-type semiconductor junction CGL to generate free charges. On the other hand, the energy levels of the p-type and n-type semiconductor junction in conventional CGLs are often not well aligned with that of their adjacent organic light emissive layers. This leads to inefficient charge injection into corresponding adjacent emissive layers. For example, if the lowest unoccupied molecular orbital (LUMO) energy level of the n-type layer is not well aligned with that of its adjacent electron transporting layer, the electrons generated in the CGL will not be injected efficiently into the adjacent single OLED emissive layer, leading to a charge imbalance and therefore reducing brightness.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a tandem Organic Light Emitting Diode (OLED) apparatus includes a buffer assisted charge generation layer including a junction of a p-type doped semiconductor layer and an n-type doped semiconductor layer, and a hole buffer layer and an electron buffer layer pair surrounding the junction of the p-type and n-type doped semiconductor layers. The OLED apparatus further including a first OLED emissive layer and a second OLED emissive layer pair surrounding the buffer assisted charge generation layer, and a cathode and anode layer pair surrounding the first and second OLED emissive layer pair.

In another embodiment disclosed herein, an active matrix display includes an array of organic light emitting diode (OLED) pixels, each of the OLED pixels including a plurality of OLED sub-pixels, at least one of the OLED sub-pixels having a buffer assisted charge generation layer including a junction of p-type doped semiconductor layer and an n-type doped semiconductor layer, and a hole buffer layer and an electron buffer layer pair surrounding the junction of the p-type and n-type doped semiconductor layers. The active matrix display further includes a first OLED emissive layer and a second OLED emissive layer pair surrounding the buffer assisted charge generation layer, a cathode and anode layer pair surrounding the first and second OLED emissive layer pair, and a driving circuit connected to and configured to provide an energizing signal to each of the plurality of sub-pixels of the array of OLED pixels within the active matrix display.

In another embodiment disclosed herein, a method of fabricating an Organic Light Emitting Diode (OLED) matrix display, includes forming an array of OLEDs pixels over a substrate, each pixel of the OLED array including a plurality of OLED sub-pixels, wherein at least one sub-pixel of the plurality of OLED subpixels include a buffer assisted charge generation layer including a p-type electrode layer adjacent an n-type electrode layer, and a hole buffer layer and an electron buffer layer surrounding the coupled p-type and n-type electrode layers. The method further includes forming a first OLED emissive layer and a second OLED emissive layer pair surrounding the buffer assisted charge generation layer and forming a cathode and anode layer pair surrounding the first and second OLED emissive layers. The method further includes providing a driving circuit connected to and configured to provide an energizing signal to each of the plurality of sub-pixels of the array of pixels within the active matrix display.

The disclosure is generally directed to a tandem OLED emissive unit that connects two single OLED units by means of a charge generation layer(s). As the CGL can generate and inject charges into the single OLED units under an electric field applied by a corresponding cathode and anode pair, sub-pixels including tandem OLEDs can double the brightness of an active matrix OLED display device at the same current density, compared to active matrix OLED display devices only including sub-pixels including a single OLED unit.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIGS. 2A-2H illustrates a series of stages of fabrication of a first embodiment of a tandem OLED pixel having a buffer assisted charge generation layer described herein;

DETAILED DESCRIPTION

Figure 1:
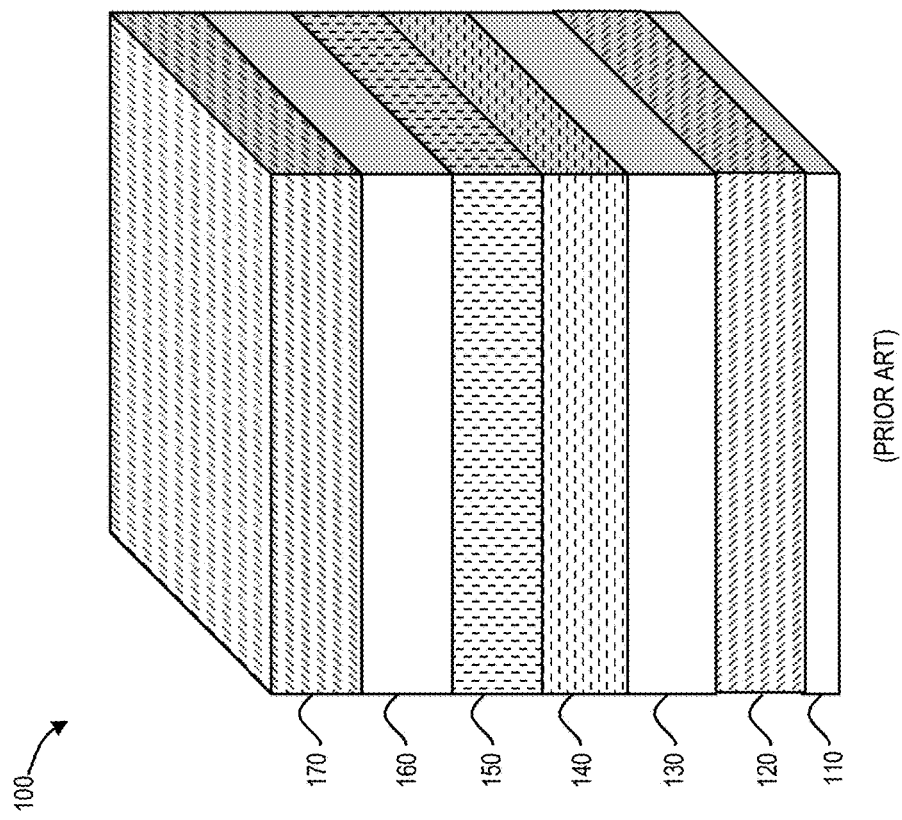
FIG. 1 illustrates a conventional tandem OLED sub-pixel including a conventional charge generation layer.

The present invention provides a buffer assisted charge generation layer, which is composed of 1) electron-buffer, 2) n-type electrode layer, 3) p-type electrode layer, and 4) hole-buffer layer, (see, e.g., FIG. 2F). Compared to conventional (non-buffer assisted) CGLs, the buffer assisted CGL incorporates a hole and electron buffer layers to assist charge injection from the CGL into the adjacent tandem single OLED emissive units.

FIGS. 2A-2H illustrate a series of stages of fabrication of a first embodiment of fabricating a tandem OLED pixel 200 (see FIG. 2H) having a buffer assisted charge generation layer.

FIG. 2A illustrates the step of providing a backplane substrate 210 that may be comprised out of silicon upon which the tandem OLED pixel 200 (see FIG. 2H) may be fabricated upon.

FIG. 2B illustrates the step of patterning an anode layer having, for example, three discrete subpixel anodes: a first sub-pixel anode layer 220, a second sub-pixel anode layer 222 and a third sub-pixel anode layer 224. Each discrete sub-pixel anode layer (220, 222 or 224) may be configured to provide a corresponding energizing signal to an OLED emissive layer fabricated upon and each may be connected to a driving circuit for controlling the same.

FIG. 2C illustrates the step of patterning a series of first 230, second 232 and third 234 sub-pixel organic emission layers over each respective sub-pixel anode layer 220, 222 and 224. Each of the organic sub-pixel emission layers (230, 232 and 234) may correspond to, for example, to any of a red, green, blue or white visible light emission source.

FIG. 2D illustrates the step of patterning an electron buffer layer 240 over each of the series of first 230, second 232 and third 234 sub-pixel organic emission layers. Electron buffer layer 240 injects electrons into the corresponding sub-pixel emissive layers 230, 232 and 234 from free charges generated in the n-type and p-type doped semiconductor junction described immediately below. The function of the electron buffer layer is to form a step which can facilitate electron injection from the CGL to the adjacent ETL of the EL unit. Common electron buffer materials can be selected from but not limited to highly conductive organic, inorganic and metal materials, e.g., LiF, LiQ, CsF, $Cs_2CO_3$, Ca, Li, Al, Mg etc.

FIG. 2E illustrates the step of patterning an n-type doped semiconductor layer 250 over the electron buffer layer 240 and patterning a p-type doped semiconductor layer 260 adjacent to and over the n-type doped semiconductor layer 250. Conventionally, only the combination of the adjacent coupled n-type 250 and p-type 260 semiconductor layers formed the charge generation layer (CGL) which generates free charges that can flow to the adjacent EL units under bias applied to the tandem device.

FIG. 2F illustrates the step of patterning a hole buffer layer 270 over the p-type doped semiconductor layer 260. Hole buffer layer 270 injects holes from free charges generated in the n-type and p-type doped semiconductor junction into a corresponding second organic emission layer described immediately below. This combination of the electron buffer layer 240, the n-type 250 and p-type 260 doped semiconductor layers and the hole buffer layer 270 forms the buffer assisted charge generation layer for the tandem pixel OLED and replaces the conventional tandem OLED CGL of the n-type and p-type doped semiconductor CGL. The function of the hole buffer layer is to form a step which can facilitate hole injection from the CGL to the adjacent HTL of the EL unit. Common hole buffer materials can be selected from but not limited to highly conductive p-type organic, inorganic and metal materials, e.g., $MoO_3$, $WO_3$, Ag, HAT-CN, $V_2O_5$, etc.

FIG. 2G illustrates the step of patterning the first 280, second 282 and third 284 sub-pixel organic emission second layers over the hole buffer layer 270.

FIG. 2H illustrates the step of patterning the corresponding cathode layer 290 over each of the first 280, second 282 and third 284 sub-pixel organic emission second layers to substantially complete the tandem sub-pixel OLED 200. Additional layers may be patterned on or above the cathode layer 290 keeping with the spirit of the embodiment described herein.

The tandem Organic Light Emitting Diode (OLED) apparatus 200 in summary includes a buffer assisted charge generation layer defined by and including a junction of a p-type doped semiconductor layer 260 and an n-type doped semiconductor layer 250, and a hole buffer layer 270 and an electron buffer layer 240 pair surrounding the junction of the p-type and n-type doped semiconductor layers (250, 260). A first OLED emissive layer 230, 232 and/or 234) and a second OLED emissive layer (280, 282 and/or 284) pair surrounds the buffer assisted charge generation layer, and a cathode 290 and anode layer (220, 222 and/or 224) pair further surrounds the first (230-234) and second (280-284) OLED emissive layer pair.

The hole buffer layer 270 may be adjacent the p-type doped semiconductor layer 260 and one of the first (230-234) or second (280-284) OLED emissive layers, and the electron buffer layer 240 may be adjacent the n-type doped semiconductor layer 250 and the other of the first (230-234) or second (280-284) OLED emissive layers.

The first (230-234) or second (280-284) OLED emissive layers may include any one of a red, green, blue or white light emission output source.

The hole buffer layer 270 may be selected from at least one from the group comprising MoO3, WO3, Ag, HAT-CN and V2O5, where the hole buffer layer 270 may be generally comprised of highly conductive p-type organic, inorganic and/or metal materials.

The electron buffer layer 240 may be selected from at least one from the group comprising LiF, LiQ, CsF, Cs2CO3, Ca, Li, Al or Mg, where the electron buffer layer 240 may be generally comprised of highly conductive organic, inorganic and/or metal materials.

Figure 3:
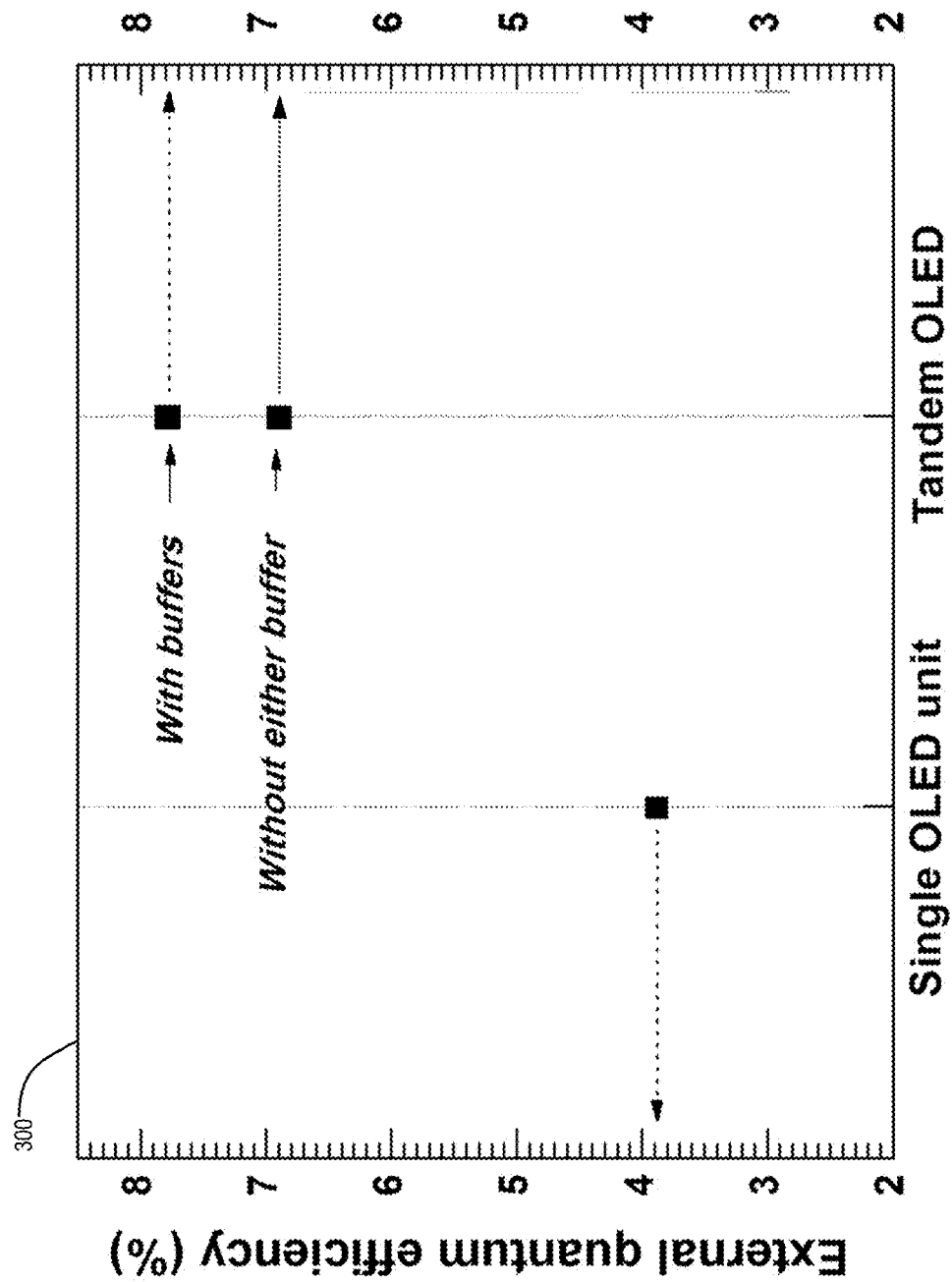
FIG. 3 illustrates a graph comparing External Quantum Efficiency (EQE) between a single blue OLED, (on the left), and a tandem blue OLED (on the right), using the buffer assisted charge generation layer described herein.

FIG. 3 compares the external quantum efficiency (EQE) between a single blue OLED, (on the left), and a tandem blue OLED, (on the right), using the buffer assisted CGL illustrated in FIGS. 2E and 2F. As shown, the EQE of the tandem device is almost 2 times (7.78% vs 3.88%) higher than that of the single emissive unit, showing that the buffer assisted CGL discussed herein works efficiently. Furthermore, FIG. 3 also shows that without either of the buffers, the EQE of the tandem device will drop to about 11%, to approximately 6.9%, respectively. This indicates that both buffer layers assist charge injection into the single units and make buffer assisted CGL work efficiently.

Figure 4:
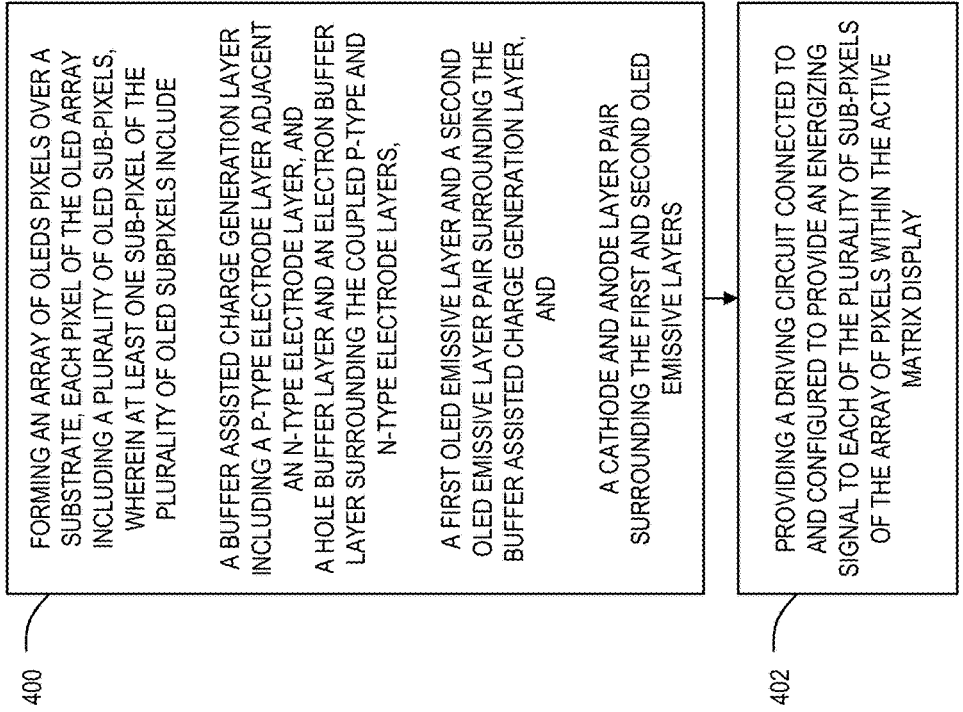
FIG. 4 illustrates a logic flowchart of a method of fabricating the first embodiment of the tandem OLED having the buffer assisted charge generation layer.

FIG. 4 illustrates a logic flowchart of a method of fabricating the first embodiment of the tandem OLED having the buffer assisted charge generation layer. The method of fabricating an OLED matrix display, includes forming 400 an array of OLEDs pixels over a substrate, where each pixel of the OLED array includes a plurality of OLED sub-pixels, and at least one sub-pixel of the plurality of OLED subpixels include a buffer assisted charge generation layer including a p-type electrode layer adjacent an n-type electrode layer, and a hole buffer layer and an electron buffer layer surrounding the coupled p-type and n-type electrode layers. The method further includes forming a first OLED emissive layer and a second OLED emissive layer pair surrounding the buffer assisted charge generation layer, and forming a cathode and anode layer pair surrounding the first and second OLED emissive layers. The method then provides (402) a driving circuit connected to and configured to provide an energizing signal to each of the plurality of sub-pixels of the array of pixels within the active matrix display.

The method may further include providing the hole buffer layer being formed adjacent the p-type electrode layer and one of the first or second OLED emissive layers, and further providing the electron buffer layer being formed adjacent the n-type electrode layer and one of the first or second OLED emissive layers.

The method may further include providing each of the plurality of sub-pixels to including one of a red, green, blue or white light emission output.

The method may further include providing the hole buffer layer being selected from at least one from the group comprising $MoO_3$, $WO_3$, Ag, HAT-CN and $V_2O_5$, and providing the electron buffer layer being selected from at least one from the group comprising LiF, LiQ, CsF, $Cs_2CO_3$, Ca, Li, Al or Mg.

Figure 5:
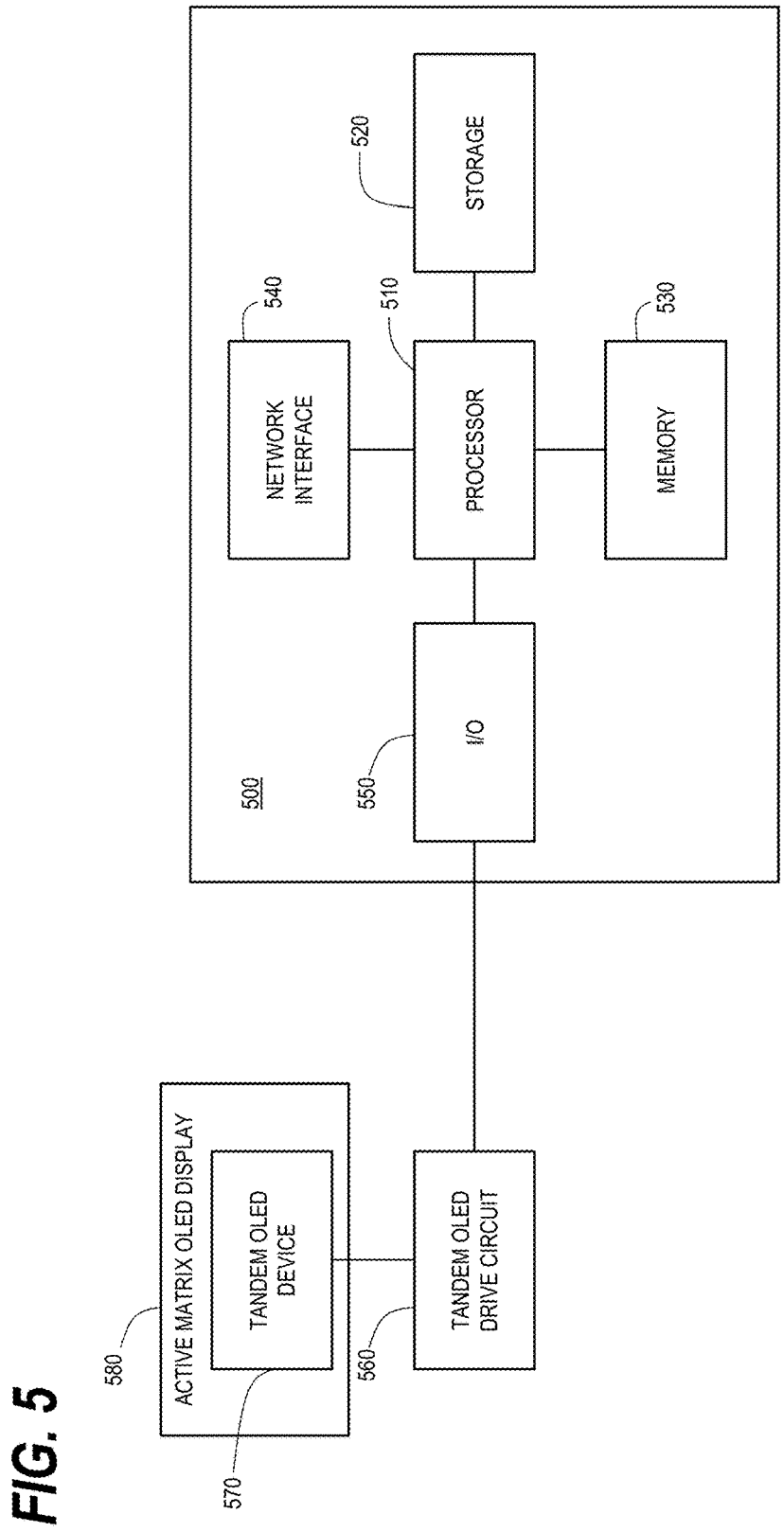
FIG. 5 illustrates a computer system according to an exemplary embodiment configured to drive a buffer assisted charge generation layer tandem OLED array of the first embodiment depicted in FIGS. 2A-4B and FIG. 4.

FIG. 5 illustrates a computer system according to an exemplary embodiment configured to drive an OLED array using the directly patterned OLED display comprised of the completed color filtered sub-pixels 130 and 230 depicted in FIG. 2D and FIG. 3D. Computer 500 can, for example, operate tandem OLED driver circuit 560 that controls the tandem OLED device 570 comprised of a plurality of fabricated OLED sub-pixels of the first embodiment 200.

High resolution active matrix displays may include millions of pixels and sub-pixels that are individually addressed by the OLED drive circuit 560. Each sub-pixel can have several semiconductor transistors and other IC components. Each OLED may correspond to a pixel or a sub-pixel, and these terms are used interchangeably herein.

Additionally, computer 500 can perform the steps described above (e.g., with respect to FIG. 4). Computer 500 contains processor 510 which controls the operation of computer 500 by executing computer program instructions which define such operation, and which may be stored on a computer-readable recording medium. The computer program instructions may be stored in storage 520 (e.g., a magnetic disk, a database) and loaded into memory 530 when execution of the computer program instructions is desired. Thus, the computer operation will be defined by computer program instructions stored in memory 530 and/or storage 520 and computer 500 will be controlled by processor 510 executing the computer program instructions. Computer 500 also includes one or more network interfaces 540 for communicating with other devices, for example other computers, servers, or websites. Network interface 540 may, for example, be a local network, a wireless network, an intranet, or the Internet. Computer 500 also includes input/output 550, which represents devices which allow for user interaction with the computer 500 (e.g., display, keyboard, mouse, speakers, buttons, webcams, etc.). One skilled in the art will recognize that an implementation of an actual computer will contain other components as well, and that FIG. 5 is a high-level representation of some of the components of such a computer for illustrative purposes.

An alternative embodiment may include an active matrix OLED display 580 including an array of tandem-type organic light emitting diode (OLED) pixels, where each of the OLED pixels include a plurality of OLED sub-pixels as illustrated in FIGS. 2A-2H, and at least one of the OLED sub-pixels may have a buffer assisted charge generation layer including a junction of p-type doped semiconductor layer 260 and an n-type doped semiconductor layer 250, and a hole buffer layer 270 and an electron buffer layer 240 pair surrounding the junction of the p-type 260 and n-type 250 doped semiconductor layers. The OLED sub-pixels 200 may further include a first OLED emissive layer (e.g., 230-234) and a second OLED emissive layer (e.g., 280-284) pair surrounding the buffer assisted charge generation layer, and a cathode 290 and anode (e.g., 220-224) layer pair surrounding the first (220-224) and second (280-284) OLED emissive layer pair. The active matrix display 580 may further include a driving circuit 560 connected to and configured to provide an energizing signal to each of the plurality of sub-pixels of the array of OLED pixels within the active matrix OLED display 580.

While only a limited number of preferred embodiments have been disclosed for purposes of illustration, it is obvious that many modifications and variations could be made thereto. This disclosure intends to cover all of those modifications and variations which fall within the scope of the present invention, as defined by the following claims.

What is claimed is:

1. A tandem Organic Light Emitting Diode (OLED) apparatus comprising:
    a buffer assisted charge generation layer including
        a junction of a p-type doped semiconductor layer and an n-type doped semiconductor layer, and
        a hole buffer layer and an electron buffer layer pair surrounding the junction of the p-type and n-type doped semiconductor layers;
    a first OLED emissive layer and a second OLED emissive layer pair surrounding the buffer assisted charge generation layer; and
    a cathode and anode layer pair surrounding the first and second OLED emissive layer pair;
    wherein the hole buffer layer is between and adjacent to the p-type doped semiconductor layer and one of the first or second OLED emissive layers, and the electron buffer layer is between and adjacent to the n-type doped semiconductor layer and the other of the first or second OLED emissive layers.

2. The apparatus according to claim 1, wherein at least one of the first or second OLED emissive layers comprises one of a red, green, blue or white light emission output.

3. The apparatus according to claim 1, wherein the hole buffer layer is selected from at least one from the group comprising $MoO_3$, $WO_3$, Ag, HAT-CN and $V_2O_5$.

4. The apparatus according to claim 1, wherein the electron buffer layer is selected from at least one from the group comprising LiF, LiQ, CsF, $Cs_2CO_3$, Ca, Li, Al or Mg.

5. The apparatus according to claim 1, wherein the electron buffer layer is comprised of highly conductive one of organic, inorganic and metal materials, and
   wherein the hole buffer layer is comprised of highly conductive one of p-type organic, inorganic and metal materials.

6. An active matrix display comprising:
   an array of organic light emitting diode (OLED) pixels, each of the OLED pixels including
      a plurality of OLED sub-pixels, at least one of the OLED sub-pixels having a buffer assisted charge generation layer including
         a junction of p-type doped semiconductor layer and an n-type doped semiconductor layer, and
         a hole buffer layer and an electron buffer layer pair surrounding the junction of the p-type and n-type doped semiconductor layers;
      a first OLED emissive layer and a second OLED emissive layer pair surrounding the buffer assisted charge generation layer; and
      a cathode and anode layer pair surrounding the first and second OLED emissive layer pair; and
   a driving circuit connected to and configured to provide an energizing signal to each of the plurality of sub-pixels of the array of OLED pixels within the active matrix display;
   wherein the hole buffer layer is between and adjacent to the p-type doped semiconductor layer and one of the first or second OLED emissive layers, and the electron buffer layer is between and adjacent to the n-type doped semiconductor layer and the other of the first or second OLED emissive layers.

7. The active matrix display according to claim 6, wherein each of the plurality of sub-pixels comprises one of a red, green, blue or white light emission output.

8. The apparatus according to claim 6, wherein the hole buffer layer is selected from at least one from the group comprising $MoO_3$, $WO_3$, Ag, HAT-CN and $V_2O_5$.

9. The apparatus according to claim 6, wherein the electron buffer layer is selected from at least one from the group comprising LiF, LiQ, CsF, $Cs_2CO_3$, Ca, Li, Al or Mg.

10. The apparatus according to claim 6, wherein the electron buffer layer is comprised of highly conductive one of organic, inorganic and metal materials, and
    wherein the hole buffer layer is comprised of highly conductive one of p-type organic, inorganic and metal materials.

11. A method of fabricating an Organic Light Emitting Diode (OLED) matrix display, comprising:
    forming an array of OLEDs pixels over a substrate, each pixel of the OLED array including a plurality of OLED sub-pixels, wherein at least one sub-pixel of the plurality of OLED subpixels include
       a buffer assisted charge generation layer including
          a p-type electrode layer adjacent an n-type electrode layer, and
          a hole buffer layer and an electron buffer layer surrounding the coupled p-type and n-type electrode layers,
       a first OLED emissive layer and a second OLED emissive layer pair surrounding the buffer assisted charge generation layer, and
       a cathode and anode layer pair surrounding the first and second OLED emissive layers; and
    providing a driving circuit connected to and configured to provide an energizing signal to each of the plurality of sub-pixels of the array of pixels within the active matrix display;
    wherein the hole buffer layer is between and adjacent to the p-type doped semiconductor layer and one of the first or second OLED emissive layers, and the electron buffer layer is between and adjacent to the n-type doped semiconductor layer the other of the first or second OLED emissive layers.

12. The method according to claim 11, further comprising:
    providing each of the plurality of sub-pixels including one of a red, green, blue or white light emission output.

13. The method according to claim 11, further comprising:
    providing the hole buffer layer being selected from at least one from the group comprising $MoO_3$, $WO_3$, Ag, HAT-CN and $V_2O_5$.

14. The method according to claim 11, further comprising:
    providing the electron buffer layer being selected from at least one from the group comprising LiF, LiQ, CsF, $Cs_2CO_3$, Ca, Li, Al or Mg.

* * * * *